United States Patent
Cao et al.

(10) Patent No.: US 11,308,726 B2
(45) Date of Patent: Apr. 19, 2022

(54) DISPLAY DEVICE AND FABRICATING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Haoran Cao, Wuhan (CN); Pilgeun Chun, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 278 days.

(21) Appl. No.: 16/615,499

(22) PCT Filed: Dec. 11, 2018

(86) PCT No.: PCT/CN2018/120398
§ 371 (c)(1),
(2) Date: Nov. 21, 2019

(87) PCT Pub. No.: WO2020/077772
PCT Pub. Date: Apr. 23, 2020

(65) Prior Publication Data
US 2021/0365658 A1 Nov. 25, 2021

(30) Foreign Application Priority Data
Oct. 15, 2018 (CN) .......................... 201811195089.6

(51) Int. Cl.
*H01L 27/32* (2006.01)
*H01L 51/00* (2006.01)
(Continued)

(52) U.S. Cl.
CPC ........ *G06V 40/1318* (2022.01); *H01L 27/323* (2013.01); *H01L 51/0034* (2013.01);
(Continued)

(58) Field of Classification Search
CPC . G06K 9/0004; H01L 27/323; H01L 51/0034; H01L 51/5253; H01L 51/5293;
(Continued)

(56) References Cited

U.S. PATENT DOCUMENTS

| 2003/0011720 A1 | 1/2003 | Kawashima |
| 2006/0093207 A1 | 5/2006 | Reicher et al. |

(Continued)

FOREIGN PATENT DOCUMENTS

| CN | 105118398 A | 12/2015 |
| CN | 107464893 A | 12/2017 |

(Continued)

*Primary Examiner* — Kyoung Lee
(74) *Attorney, Agent, or Firm* — Benesch, Friedlander, Coplan & Aronoff LLP (57) ABSTRACT

A display device and a fabricating method thereof are provided. The display device has a display panel and an optical fingerprint recognition sensor. The display panel has a transparent organic material layer, a barrier layer, a buffer layer, and an array substrate sequentially stacked and disposed from bottom to top. A surface of the transparent organic material layer opposite to the barrier layer is a back surface of the transparent organic material layer. The optical fingerprint recognition sensor is disposed on the back surface of the transparent organic material layer.

19 Claims, 4 Drawing Sheets

(51) Int. Cl.
*G06V 40/13* (2022.01)
*H01L 51/52* (2006.01)
*H01L 51/56* (2006.01)

(52) U.S. Cl.
CPC ...... *H01L 51/5253* (2013.01); *H01L 51/5293* (2013.01); *H01L 51/56* (2013.01); *H01L 2227/323* (2013.01); *H01L 2251/5338* (2013.01)

(58) Field of Classification Search
CPC .............. H01L 51/56; H01L 2227/323; H01L 2251/5338
See application file for complete search history.

(56) References Cited

U.S. PATENT DOCUMENTS

| | | |
|---|---|---|
| 2019/0036024 A1 | 1/2019 | Bai |
| 2019/0067408 A1 | 2/2019 | Sun et al. |
| 2019/0107665 A1 | 4/2019 | Bu et al. |
| 2019/0187756 A1 | 6/2019 | Sun |
| 2020/0292741 A1* | 9/2020 | Rhee .................. G02B 5/0294 |

FOREIGN PATENT DOCUMENTS

| | | |
|---|---|---|
| CN | 107579104 A | 1/2018 |
| CN | 108073900 A | 5/2018 |
| CN | 108279459 A | 7/2018 |
| CN | 108549499 A | 9/2018 |

* cited by examiner

DISPLAY DEVICE AND FABRICATING METHOD THEREOF

CROSS-REFERENCE TO RELATED APPLICATIONS

This application is a U.S. national phase application of a PCT Application No. PCT/CN2018/120398 filed on Dec. 11, 2018, which claims priority to a Chinese Patent Application No. 201811195089.6 filed on Oct. 15, 2018, the disclosures of which are incorporated in their entirety by reference herein.

FIELD OF DISCLOSURE

The present disclosure relates to displays, and more particularly to a display and a fabricating method thereof.

BACKGROUND OF DISCLOSURE

As one of the most widely used biometric identification technologies, fingerprint recognition technology has advantages of low error matching rate and fast recognition speed, and is increasingly used in terminal devices such as smart phones and tablet computers. For example, in a field of application of smart phones, a fingerprint recognition module is usually integrated in a screen to better achieve a full screen. The fingerprint recognition module integrated in the screen can be achieved by an optical fingerprint recognition technology, which mainly uses a light reflected by a finger to be received by a sensor, thereby distinguishing texture of the fingerprint. Therefore, it is necessary to maintain a high pass rate in a light propagation path between the sensor and the finger.

In conventional display panels, in particular, active matrix/organic light emitting diode (AMOLED) display panels, a polyimide (PI) plate is generally used as a back plate of the display panels, so as to support an array substrate, an organic light-emitting layer, a touch panel, and the like. A fingerprint recognition sensor is then disposed on a back surface of the PI plate. However, a color of the PI plate is usually light yellow and has a low light transmittance, which affects the sensor to receive the light reflected by the finger and reduces an accuracy of fingerprint recognition.

SUMMARY OF DISCLOSURE

An embodiment of the present application provides a display device and a fabricating method thereof, which are beneficial to improving an accuracy of fingerprint recognition.

An embodiment of the present application provides a display device comprising a display panel and an optical fingerprint recognition sensor. The display panel comprises a transparent organic material layer, a barrier layer, a buffer layer, and an array substrate sequentially stacked and disposed from bottom to top. A surface of the transparent organic material layer opposite to the barrier layer is a back surface of the transparent organic material layer, and the optical fingerprint recognition sensor is disposed on the back surface of the transparent organic material layer, wherein the back surface of the transparent organic material layer is provided with a groove, the optical fingerprint recognition sensor is disposed in the groove, and the transparent organic material layer is a polyester film layer.

In a display device provided by the present application, a material of the buffer layer is at least one of silicon nitride and silicon oxide.

In a display device provided by the present application, a number of the optical fingerprint recognition sensor is plural, and the plurality of optical fingerprint recognition sensors are distributed on the back surface of the transparent organic material layer, wherein positions of the optical fingerprint recognition sensors correspond to a part of display areas or all of the display areas of the display panel.

In a display device provided by the present application, the plurality of optical fingerprint recognition sensors are distributed on the back surface of the transparent organic material layer in array.

In a display device provided by the present application, the display panel is a flexible AMOLED display panel, and the display panel further comprises an electroluminescent layer, a thin film encapsulation layer, a touch layer, a polarizing sheet, and a cover plate.

An embodiment of the present application further provides a display panel and an optical fingerprint recognition sensor. The display panel comprises a transparent organic material layer, a barrier layer, a buffer layer, and an array substrate sequentially stacked and disposed from bottom to top. A surface of the transparent organic material layer opposite to the barrier layer is a back surface of the transparent organic material layer, and the optical fingerprint recognition sensor is disposed on the back surface of the transparent organic material layer.

In a display device provided by the present application, the back surface of the transparent organic material layer is provided with a groove, and the optical fingerprint recognition sensor is disposed in the groove.

In a display device provided by the present application, a material of the buffer layer is at least one of silicon nitride and silicon oxide.

In a display device provided by the present application, the transparent organic material layer is a polyester film layer.

In a display device provided by the present application, a number of the optical fingerprint recognition sensor is plural, and the plurality of optical fingerprint recognition sensors are distributed on the back surface of the transparent organic material layer, wherein positions of the optical fingerprint recognition sensors correspond to a part of display areas or all of the display areas of the display panel.

In a display device provided by the present application, the plurality of optical fingerprint recognition sensors are distributed on the back surface of the transparent organic material layer in array.

In a display device provided by the present application, the display panel is a flexible AMOLED display panel, and the display panel further comprises an electroluminescent layer, a thin film encapsulation layer, a touch layer, a polarizing sheet, and a cover plate.

An embodiment of the present application further provides a fabricating method of a display device, comprising steps of:

providing a base plate;

forming a buffer layer and an array substrate on the base plate in sequence;

removing the base plate, and forming a barrier film layer on a surface of the buffer layer opposite to the array substrate;

forming a transparent organic material layer on a surface of the barrier film layer opposite to the buffer layer, wherein a surface of the transparent organic material layer opposite to the barrier layer is a back surface of the transparent organic material layer; and mounting an optical fingerprint recognition sensor on the back surface of the transparent organic material layer.

In a fabricating method provided by the present application, after forming the transparent organic material layer on the surface of the barrier film layer opposite to the buffer layer, the fabricating method further comprises:

forming a groove on the back surface of the transparent organic material layer, wherein the step of mounting the optical fingerprint sensor on the back surface of the transparent organic material layer comprises:

mounting the optical fingerprint sensor in the groove.

In a fabricating method provided by the present application, the step of providing the base plate comprises:

providing a glass plate; and forming a polyimide film layer on the glass plate to form the base plate, wherein the step of removing the base plate comprises: separating the glass plate from the polyimide film layer by a laser lift-off process, and then separating the polyimide film layer from the buffer layer by the laser lift-off process to remove the base plate.

In a fabricating method provided by the present application, after the step of forming the buffer layer and the array substrate on the substrate in sequence further comprises:

forming an electroluminescent layer, a thin film encapsulation layer, and a touch layer on the array substrate in sequence; and forming a polarizing sheet or a protective film on the touch layer.

In a fabricating method provided by the present application, the transparent organic material layer is a polyester film layer.

In a fabricating method provided by the present application, a material of the buffer layer is at least one of silicon nitride and silicon oxide.

In a fabricating method provided by the present application, a number of the optical fingerprint recognition sensor is plural, and positions of the plurality of optical fingerprint recognition sensors correspond to a part of display areas or all of the display areas of the display device.

A display device of the present application comprises a display panel and an optical fingerprint recognition sensor. The display panel comprises a transparent organic material layer, a barrier layer, a buffer layer, and an array substrate sequentially stacked and disposed from bottom to top. A surface of the transparent organic material layer opposite to the barrier layer is a back surface of the transparent organic material layer, and the optical fingerprint recognition sensor is disposed on the back surface of the transparent organic material layer. Compared with the conventional method using the PI substrate as the back sheet, the light transmittance can be improved by using the transparent organic material layer, the barrier layer, and the buffer layer as the back plate of the display panel, so that the optical fingerprint recognition sensor can receive more light reflected by the fingers and improve the accuracy of fingerprint recognition.

DESCRIPTION OF DRAWINGS

In order to more clearly describe embodiments of the present application, drawings required to be used for the embodiments are simply described hereinafter. Apparently, the drawings described below only illustrate some embodiments of the present application. Those skilled in the art can obtain other drawings based on these drawings disclosed herein without creative effort.

DETAILED DESCRIPTION OF PREFERRED EMBODIMENTS

The technical solutions in the embodiments of the present application are clearly and completely described in the following with reference to the drawings in the embodiments of the present application. It is obvious that the described embodiments are only a part of the embodiments of the present application, and not all of the embodiments. All other embodiments obtained by one skilled in the art based on the embodiments of the present application without creative efforts are within the scope of the present application.

Figure 1:
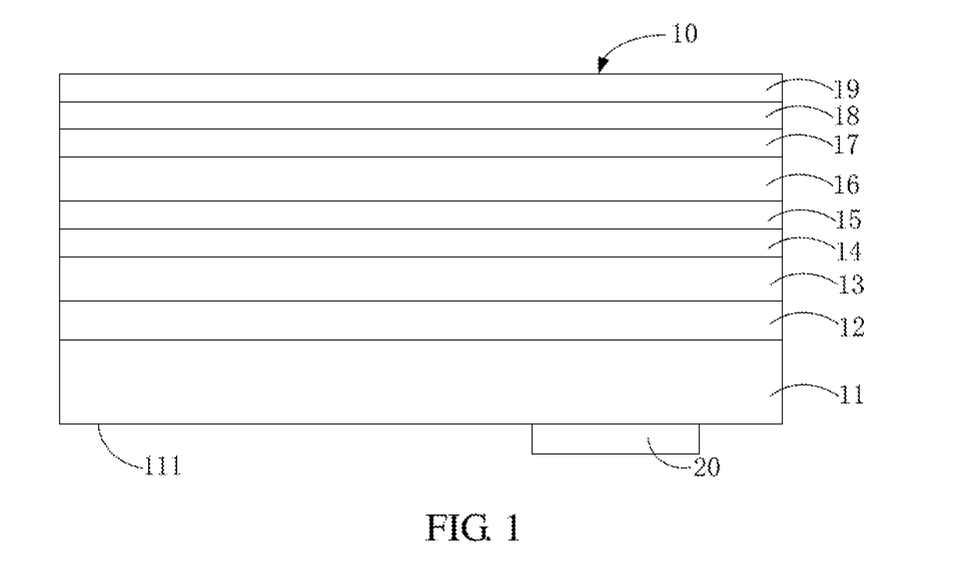
FIG. 1 is a structural schematic diagram of a display device provided by an embodiment of the present application.

Referring to FIG. 1, in an embodiment of a display device of the present application, the display device includes a display panel 10 and an optical fingerprint recognition sensor 20. The optical fingerprint recognition sensor 20 is integrated in the display panel 10.

The display panel 10 includes a transparent organic material layer 11, a barrier layer 12, a buffer layer 13, and an array substrate 14 sequentially stacked and disposed from bottom to top. The layers can be bonded each other by an optically clear adhesive (OCA) or other adhesives. Further, the display panel 10 can be a flexible active matrix/organic light emitting diode (AMOLED) display panel, which may further include an electroluminescent (EL) layer 15, a thin film encapsulation (TFE) layer 16, a touch layer 17, a polarizing sheet 18, and a cover plate 19. A thin film transistor array is formed on the array substrate 14 for driving the electroluminescent layer 15 to emit light, so as to achieve screen display.

Of course, in other embodiments, the display panel 10 can also be a rigid AMOLED display panel or other types of display panel.

The transparent organic material layer 11 is formed of an organic material, and may be, for example, a polyester (PET) film layer, which can improve the stiffness of the display panel 10. The barrier layer 12 is formed of a transparent material. The material of the buffer layer 13 may be an inorganic substance such as at least one of silicon nitride and silicon oxide, or a combination of silicon nitride and silicon oxide.

A surface of the transparent organic material layer 11 opposite to the barrier layer 12 is a back surface 111, which can also be understood as a back surface of the display panel 10. The optical fingerprint recognition sensor 20 is disposed on the back surface 111 of the transparent organic material layer 11, and has a position which can be corresponding to a display area of the display panel 10. From above, when a user's finger is placed in the display area of the display panel 10 for fingerprint operation, a light reflected by the finger passes through the array substrate 14, the buffer layer 13, the barrier layer 12, and the transparent organic material layer 11, and is then received by the optical fingerprint sensor 20. The optical fingerprint recognition sensor 20 realizes fingerprint recognition by receiving light reflected by the finger.

In this embodiment, the optical fingerprint recognition sensor 20 is disposed on the back surface of the transparent organic material layer 11 by using the transparent organic material layer 11, the barrier layer 12, and the buffer layer 13 as the back plate of the display panel 20 to support devices of the array substrate 14. Compared with a method of using a polyimide (PI) plate as the back plate, the transmittance of the light is improved, so that the optical fingerprint recognition sensor can receive more light reflected by the finger and improve the accuracy of fingerprint recognition.

Figure 2:
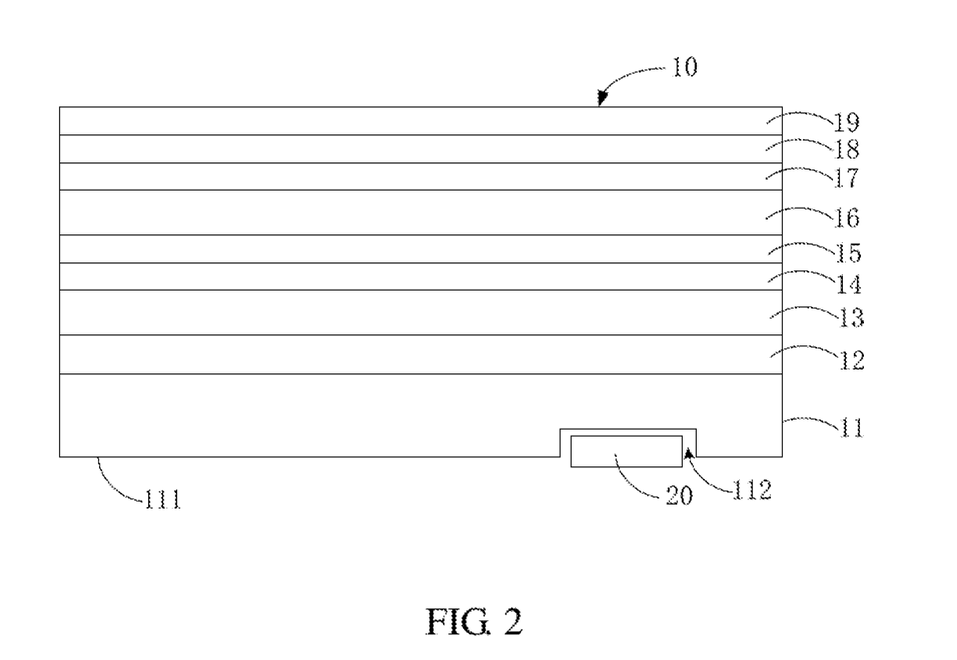
FIG. 2 is another structural schematic diagram of a display device provided by an embodiment of the present application.

Referring to FIG. 2, in another embodiment of the display device of the present application, a groove 112 can be disposed on the back surface 111 of the transparent organic material layer 11, and the optical fingerprint recognition sensor 20 is disposed in the groove 112, which is beneficial to reducing a thickness of the display device.

Figure 3:
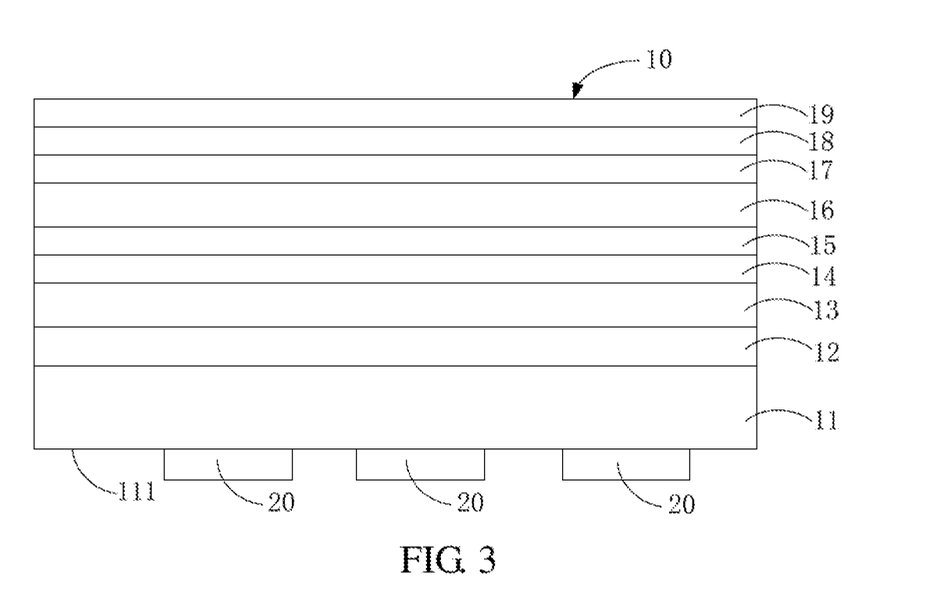
FIG. 3 is a further structural schematic diagram of a display device provided by an embodiment of the present application.

A number of the optical fingerprint recognition sensors 20 may be one, two or more to implement local fingerprint recognition or full screen fingerprint recognition correspondingly, and a specific number may be disposed according to actual needs. For example, referring to FIG. 3, when there are multiple optical fingerprint recognition sensors 20, a plurality of optical fingerprint recognition sensors 20 are disposed on the back surface of the transparent organic material layer 11, and can be distributed in an array or be distributed irregularly and disorderly, wherein the number and distributing positions of the optical fingerprint recognition sensors 20 of the distribution are different, and sizes and positions of the fingerprint recognition areas in the display area of the display panel 20 are also different.

Figure 4:
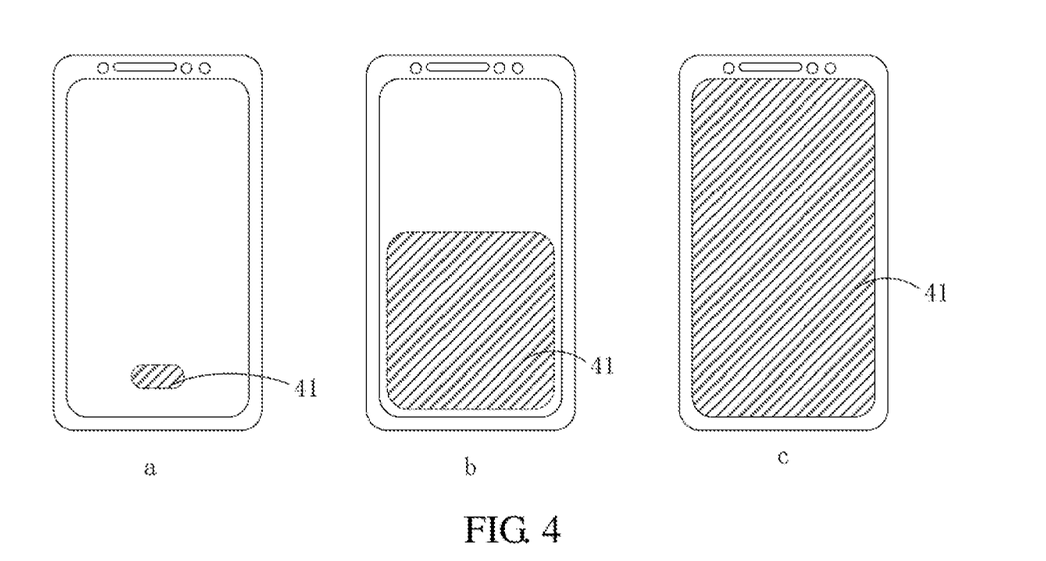
FIGS. 4a-4c are schematic diagrams of fingerprint identification areas corresponding to different numbers of optical fingerprint recognition sensors in a display device provided by an embodiment of the present application.

As shown in FIGS. 4a-4c, FIGS. 4a-4c are schematic diagrams of a fingerprint identification area corresponding to different numbers of optical fingerprint recognition sensors. In FIG. 4a, a number of optical fingerprint recognition sensors 20 may be set to be few, for example, one. Further, a position of this one fingerprint recognition sensor 20 on the transparent organic material layer 11 may correspond to a small area below the display area, and a fingerprint identification area 41 is small at this time. In FIG. 4b, a number of the optical fingerprint recognition sensors 20 can be disposed to be more, for example, three or five, and the optical fingerprint recognition sensors are all distributed below the display area, for example, occupying half of the entire display area. At this time, a relatively large fingerprint recognition area 41 can be obtained. In FIG. 4c, a number of the optical fingerprint recognition sensors is further more and can be distributed throughout the display area, so that the entire display area can realize fingerprint recognition. At this time, the fingerprint identification area 41 is a full screen area.

Figure 5:
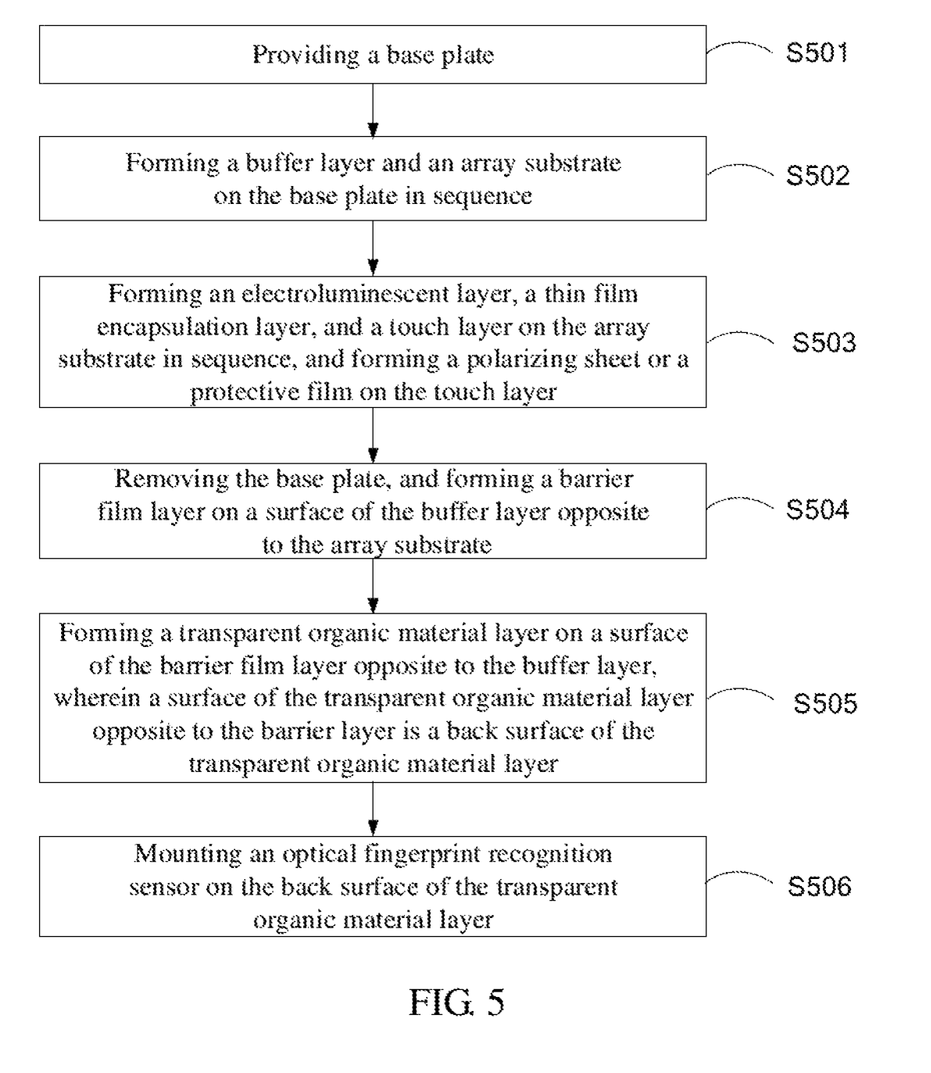
FIG. 5 is a flowchart of a fabricating method of a display device provided by an embodiment of the present application.

Referring to FIG. 5, in an embodiment of the fabricating method of a display device of the present application, the fabricating method is used to fabricate the display device of any of the above embodiments, which can include the following steps.

In step S501, a base plate is provided.

Specifically, step S501 may include the following substeps of:

(11): providing a glass plate; and (12): forming a PI film layer on the glass plate to form the base plate.

Therefore, in this embodiment, the base plate can be formed by a glass plate and a PI film, or may be a glass plate in other embodiments.

In step S502, a buffer layer and an array substrate are formed on the base plate in sequence.

Material of the buffer layer is inorganic and may be at least one of silicon nitride and silicon oxide.

In step S503, an electroluminescent layer, a thin film encapsulation layer, and a touch layer are formed on the array substrate in sequence, and a polarizing sheet or a protective film is formed on the touch layer.

When a protective film is formed on the touch layer, a polarizing sheet can be formed on the touch layer after the protective film is removed in the subsequent process, and then the cover plate can be formed on the polarizing sheet. Alternatively, in other embodiments, in step S503, after the array substrate is formed, a touch layer can be not formed. In this case, the electroluminescent layer, the thin film encapsulation layer, the polarizing sheet, and the protective film may be sequentially arranged on the array substrate. After the protective film is peeled off in the following process, the touch layer is formed on the polarizing sheet, and the cover plate is adhered thereto.

In step S504, the base plate is removed, and a barrier film layer is formed on a surface of the buffer layer opposite to the array substrate.

Figure 6:
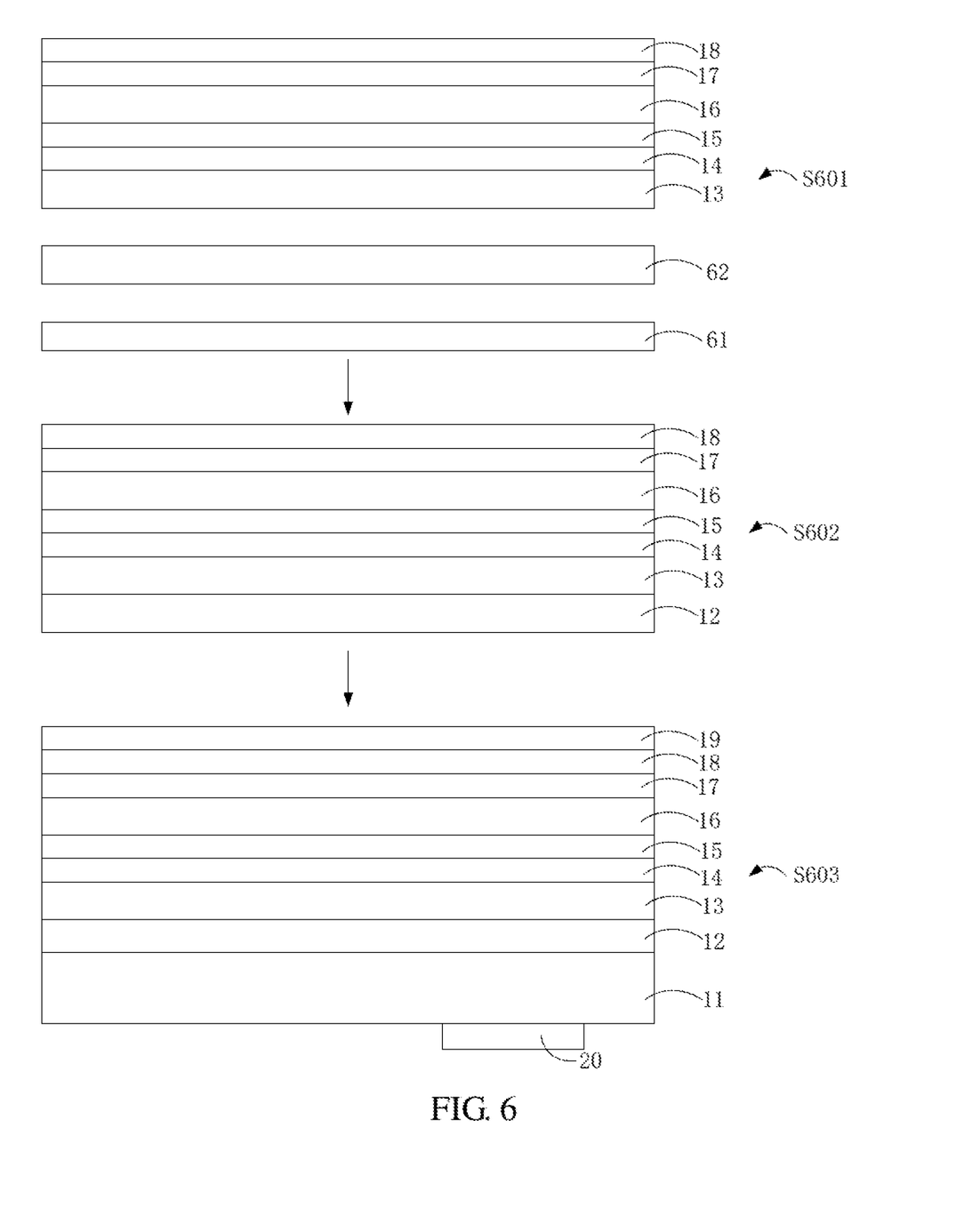
FIG. 6 is a process structural schematic diagram of a fabricating method of a display device provided by an embodiment of the present application.

Referring to FIG. 6, the base plate includes a glass plate 61 and a PI film layer 62. After a buffer layer 13, an array substrate 14, an electroluminescent layer 15, an encapsulation film layer 16, a touch layer 17, and a polarizing sheet 18 are formed on the PI film layer 62 of the base plate, the base plate is removed. Specifically, as shown in step S601 of FIG. 6, the glass plate 61 is separated from the PI film layer 62 by a laser lift-off (LLO) process, and then the PI film layer 62 is separated from the buffer layer 13 by the LLO process to remove the base plate. Thereafter, in step 602, the barrier layer 12 is formed on a surface of the buffer layer 13 opposite to the array substrate 14.

In step S505, a transparent organic material layer is formed on a surface of the barrier film layer opposite to the buffer layer, wherein a surface of the transparent organic material layer opposite to the barrier layer is a back surface of the transparent organic material layer.

Corresponding to step 603 shown in FIG. 6, a transparent organic material layer 11 is formed on the surface of the barrier film layer 12 opposite to the buffer layer 13. From above, the display panel in the display device can be fabricated by steps S501 to S505.

In step S506, an optical fingerprint recognition sensor is mounted on the back surface of the transparent organic material layer.

As shown in step 603 of FIG. 6, the optical fingerprint recognition sensor 20 is mounted on the back surface of the transparent organic material layer 11.

In one embodiment, after forming the transparent organic material layer, a groove can be formed on the back surface of the transparent organic material layer. Then, the optical fingerprint recognition sensor is mounted in the groove, so as to reduce a thickness of the display device. Further, a number of the optical fingerprint recognition sensors can be disposed according to actual needs, for example, one, two, or more, wherein when there are multiple optical fingerprint recognition sensors, positions of the optical fingerprint recognition sensors can correspond to a part of display areas or all of the display areas of the display panel.

In an embodiment of the present application, compared with the conventional method using a PI substrate as a back plate, the transmittance of light can be improved by using a transparent organic material layer, a barrier layer, and a buffer layer as a back plate of a device such as an array substrate, so that the optical fingerprint recognition sensor can receive more light reflected by the finger and improve the accuracy of fingerprint recognition.

The display device and the preparation method thereof provided by the embodiments of the present application are described in detail above. The principles and implementations of the present application have been described in the following by using specific examples. The description of the above embodiments is only for helping to understand the method of the present application and its core ideas. At the same time, for those skilled in the art, according to the idea of the present application, there will be changes in specific implementation manners and application scopes. In summary, a content of the present specification should not be construed as limiting the present application.

The invention claimed is:

1. A display device, comprising a display panel and an optical fingerprint recognition sensor, the display panel comprising a transparent organic material layer, a barrier layer, a buffer layer, and an array substrate sequentially stacked and disposed from bottom to top, wherein a surface of the transparent organic material layer opposite to the barrier layer is a back surface of the transparent organic material layer, and the optical fingerprint recognition sensor is disposed on the back surface of the transparent organic material layer,
wherein the back surface of the transparent organic material layer is provided with a groove, the optical fingerprint recognition sensor is disposed in the groove, and the transparent organic material layer is a polyester film layer.

2. The display device according to claim 1, wherein material of the buffer layer is at least one of silicon nitride and silicon oxide.

3. The display device according to claim 1, wherein a number of the optical fingerprint recognition sensor is plural, and the plurality of optical fingerprint recognition sensors are distributed on the back surface of the transparent organic material layer, wherein positions of the optical fingerprint recognition sensors correspond to a part of display areas or all of the display areas of the display panel.

4. The display device according to claim 3, wherein the plurality of optical fingerprint recognition sensors are distributed on the back surface of the transparent organic material layer in arrays.

5. The display device according to claim 1, wherein the display panel is a flexible active matrix/organic light emitting diode (AMOLED) display panel, and the display panel further comprises an electroluminescent layer, a thin film encapsulation layer, a touch layer, a polarizing sheet, and a cover plate.

6. A display device, comprising a display panel and an optical fingerprint recognition sensor, the display panel comprising a transparent organic material layer, a barrier layer, a buffer layer, and an array substrate sequentially stacked and disposed from bottom to top, wherein a surface of the transparent organic material layer opposite to the barrier layer is a back surface of the transparent organic material layer, and the optical fingerprint recognition sensor is disposed on the back surface of the transparent organic material layer.

7. The display device according to claim 6, wherein the back surface of the transparent organic material layer is provided with a groove, and the optical fingerprint recognition sensor is disposed in the groove.

8. The display device according to claim 6, wherein material of the buffer layer is at least one of silicon nitride and silicon oxide.

9. The display device according to claim 6, wherein the transparent organic material layer is a polyester film layer.

10. The display device according to claim 6, wherein a number of the optical fingerprint recognition sensor is plural, and the plurality of optical fingerprint recognition sensors are distributed on the back surface of the transparent organic material layer, wherein positions of the optical fingerprint recognition sensors correspond to a part of display areas or all of the display areas of the display panel.

11. The display device according to claim 10, wherein the plurality of optical fingerprint recognition sensors are distributed on the back surface of the transparent organic material layer in arrays.

12. The display device according to claim 6, wherein the display panel is a flexible active matrix/organic light emitting diode (AMOLED) display panel, and the display panel further comprises an electroluminescent layer, a thin film encapsulation layer, a touch layer, a polarizing sheet, and a cover plate.

13. A fabricating method of a display device, comprising steps of:
providing a base plate;
forming a buffer layer and an array substrate on the base plate in sequence;
removing the base plate, and forming a barrier film layer on a surface of the buffer layer opposite to the array substrate;
forming a transparent organic material layer on a surface of the barrier film layer opposite to the buffer layer, wherein a surface of the transparent organic material layer opposite to the barrier layer is a back surface of the transparent organic material layer; and
mounting an optical fingerprint recognition sensor on the back surface of the transparent organic material layer.

14. The fabricating method according to claim 13, wherein after forming the transparent organic material layer on the surface of the barrier film layer opposite to the buffer layer, the fabricating method further comprises:
forming a groove on the back surface of the transparent organic material layer,
wherein the step of mounting the optical fingerprint recognition sensor on the back surface of the transparent organic material layer comprises mounting the optical fingerprint recognition sensor in the groove.

15. The fabricating method according to claim 13, wherein the step of providing the base plate comprises:
providing a glass plate; and
forming a polyimide film layer on the glass plate to form the base plate,
wherein the step of removing the base plate comprises separating the glass plate from the polyimide film layer by a laser lift-off process, and then separating the polyimide film layer from the buffer layer by the laser lift-off process to remove the base plate.

16. The fabricating method according to claim 13, wherein after the step of forming the buffer layer and the array substrate on the substrate in sequence further comprises:
  forming an electroluminescent layer, a thin film encapsulation layer, and a touch layer on the array substrate in sequence; and
  forming a polarizing sheet or a protective film on the touch layer.

17. The fabricating method according to claim 13, wherein the transparent organic material layer is a polyester film layer.

18. The fabricating method according to claim 13, wherein material of the buffer layer is at least one of silicon nitride and silicon oxide.

19. The fabricating method according to claim 13, wherein a number of the optical fingerprint recognition sensor is plural, and positions of the plurality of optical fingerprint recognition sensors correspond to a part of display areas or all of the display areas of the display device.

* * * * *